United States Patent [19]

Le Goff épouse Hénaff et al.

[11] Patent Number: 4,583,047
[45] Date of Patent: Apr. 15, 1986

[54] RECEPTION CIRCUIT FOR A WAVE MODULATED AT ONE TIME IN FREQUENCY BY AN ANALOG SIGNAL AND AT ANOTHER TIME IN PHASE BY A DIGITAL SIGNAL

[75] Inventors: Jeannine Le Goff épouse Hénaff, Clamart; Jacques Veillard, Saint-Grégoire; Daniel Pommier, Mordelles, all of France

[73] Assignee: Etablissement Public de Diffusion dit "Telediffusion de France", Montrouge, France

[21] Appl. No.: 659,232

[22] Filed: Oct. 9, 1984

[30] Foreign Application Priority Data

Oct. 12, 1983 [FR] France .................. 83 16325

[51] Int. Cl.⁴ .............................................. H03D 3/00
[52] U.S. Cl. ........................... 329/112; 329/110; 329/134; 329/145; 455/207; 333/193
[58] Field of Search ............. 329/110, 112, 117, 118, 329/134, 145, 147, 192; 455/205, 207, 210, 214; 375/80, 94; 333/193

[56] References Cited

U.S. PATENT DOCUMENTS

| | | | |
|---|---|---|---|
| 3,835,422 | 9/1974 | Hartemann | 333/72 |
| 3,936,751 | 2/1976 | Holmes et al. | 329/119 X |
| 3,980,962 | 9/1976 | Scotter | 329/117 |
| 3,987,367 | 10/1976 | Hartemann | 329/118 |
| 4,169,286 | 9/1979 | Uzunoglu | 333/193 |
| 4,234,930 | 11/1980 | Campbell | 375/80 |

Primary Examiner—Eugene R. LaRoche
Assistant Examiner—Robert J. Pascal
Attorney, Agent, or Firm—Laff, Whitesel, Conte & Saret

[57] ABSTRACT

The circuit comprises a surface acoustic wave device. On the substrate (32) of the surface acoustic wave device, are provided two pairs of input transducers (33, 34, 35, 36) connected, in parallel, to the input of the circuit. The transducers (33, 34, 35, 36) initiate surface acoustic waves corresponding to the signals applied on two pairs of paths (41, 42, 43, 44) ending at two pairs of reception transducers (37, 38, 39, 40). The outputs of the output transducers of the first pair (37, 38) are connected to the two inputs of a mixer (28) whose output yields the received digital signal. The outputs of the second pair of transducers (39, 40) are connected to the inputs of two limiters (26, 27) whose outputs are connected to the two inputs of a mixer (29) whose output yields the analog signal. The difference in path lengths of the first pair (41, 42) introduces a delay of the order of one bit and the difference in path lengths of the second pair (43, 44) introduces a delay equal to the inverse of twice the bandwidth between the peaks of the discriminator thus constituted.

10 Claims, 8 Drawing Figures

RECEPTION CIRCUIT FOR A WAVE MODULATED AT ONE TIME IN FREQUENCY BY AN ANALOG SIGNAL AND AT ANOTHER TIME IN PHASE BY A DIGITAL SIGNAL

The present invention concerns a circuit, comprising a surface acoustic wave device, for receiving electrical waves alternately modulated, either in frequency by an analog signal, or in phase by a digital signal.

BACKGROUND OF THE INVENTION

Such a modulator is used in particular in satellite radio broadcasting systems in which the broadcast signal consists of a time multiplex of a carrier frequency modulated by the picture signal during the active period of one television line and a carrier phase modulated by a digital signal during the line suppression interval. This satellite radio broadcasting system is known in the European Radio Broadcasting Unit (ERU) under the name of "C system". More particularly in this sytem, the digital modulation used is MDP2-4 which consists of a binary modulation which has four states that differ by 90°, in which the binary 1 symbol is transmitted by a jump in phase of +90° and the symbol 0 is transmitted by a jump in phase of −90°. The MDP2-4 modulation is completely described in European patent No. EP-A-0032325. It has the salient feature of having an almost constant envelope after filtering. In the C system, the instantaneous digital bit rate is of 20.25 Mbit/s and the duration of a burst is 10 microseconds.

Of course, in the C system receiving equipment, it is necessary to provide a modulated carrier amplification stage, then a division in two channels one of which comprises an analog frequency demodulator which yields the picture signal and the other a digital differential demodulator which yields the data signal at 20.25 Mbit/s.

SUMMARY OF THE INVENTION

One object of the invention consists in providing a solid state circuit whose substrate supports the frequency demodulator and the digital differential demodulator.

In accordance with a characteristic of the invention, a receiver circuit is provided, comprised of a surface acoustic wave device, on whose substrate is provided, in parallel, two pairs of input transducers, at the input of the receiver circuit, the input transducers initiating acoustic waves corresponding to the signals applied to the input on two paths ending at two pairs of reception transducers, the lengths of the paths of each pair of paths being different, the outputs of the first pair of output transducers being respectively connected to the two inputs of a first mixer whose output yields the received digital signal and the outputs of the second pair of transducers being respectively connected to the inputs of two limiters whose outputs are respectively connected to the two inputs of a second mixer whose output yields the analog signal, the difference in path lengths of the first pair introducing a delay of the order of 1 bit and the difference in path lengths of the second pair introducing a delay equal to twice the bandwidth between the peaks of the discriminator thus constituted.

In accordance with another characteristic, pair of sets each comprise one pair of input transducers and the associated pair of output transducers comprises modulated combs giving it predetermined impulse and frequency responses.

In accordance with another characteristic, each pair of transducers is replaced by a single transducer of double width.

In accordance with another characteristic, the pairs are parallel, but propagate in opposite directions.

In accordance with another characteristic, the pairs of input transducers are replaced by a single bidirectional input transducer with, on one side, a pair of paths to the first pair of output transducers and, on the other side, another pair of paths going to the other pair of output transducers.

The characteristics of the above-mentioned invention, as well as others, will become clearer upon reading the description of embodiments, the description being carried out in conjunction with the attached figures, among which:

DETAILED DESCRIPTION

Figure 1:
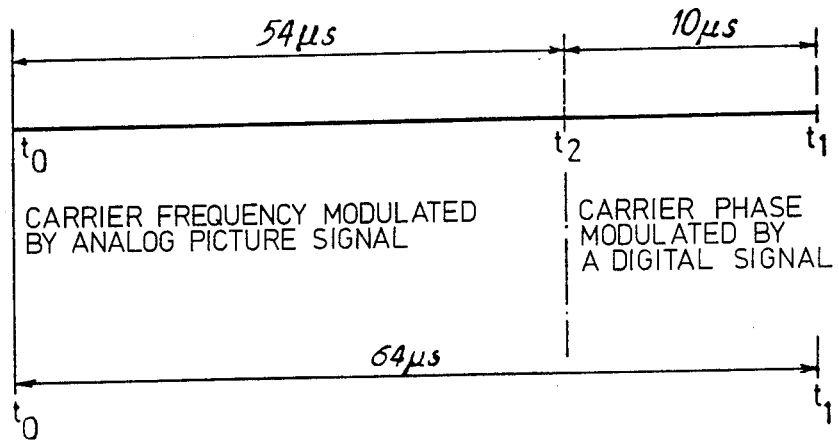
FIG. 1 is a diagram illustrating the multiplexing of signals transmitted in the C system.

With regard to FIG. 1, we recall that the complete picture signal occupies, in the 625 lines standard, 64 microseconds between the instants t0 and t1, that the useful picture signal occupies 54 microseconds between t0 and t2, and the line blanking signal occupies 10 microseconds between t2 and t1. In the group C satellite radio broadcasting system, the useful signal between t0 and t2 is transmitted by frequency modulating the carrier while the blanking interval signals are transmitted between t2 and t1 by digitally modulating the carrier. It should be noted that the signals contained between t2 and t1 are also used to reconstruct the synchronization information, the black reference level and the color reference signal.

Figure 2:
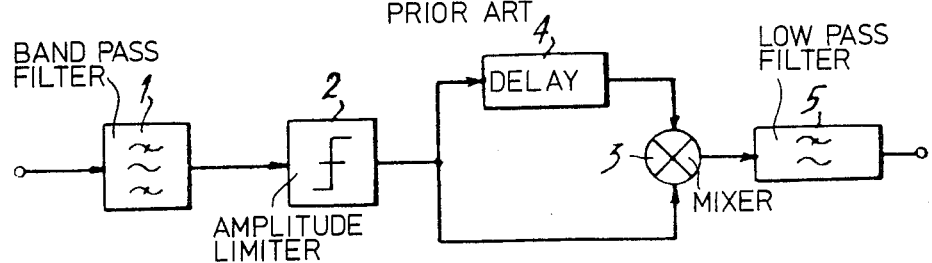
FIG. 2 illustrates a known analog frequency demodulator circuit.

The analog frequency demodulator shown in FIG. 2 comprises a bandpass filter 1 with center frequency F2 and bandwidth of 27 MHz, for example, followed by an amplitude limiter 2 one output of which is directly connected to one input of a mixer 3 and whose other output is connected to the other input of a mixer 3 through a delay circuit 4 whose delay is of the order of 15 nanoseconds, the output of mixer 3 being connected to the input of a low pass filter 5 which yields the useful picture signal.

Figure 3:
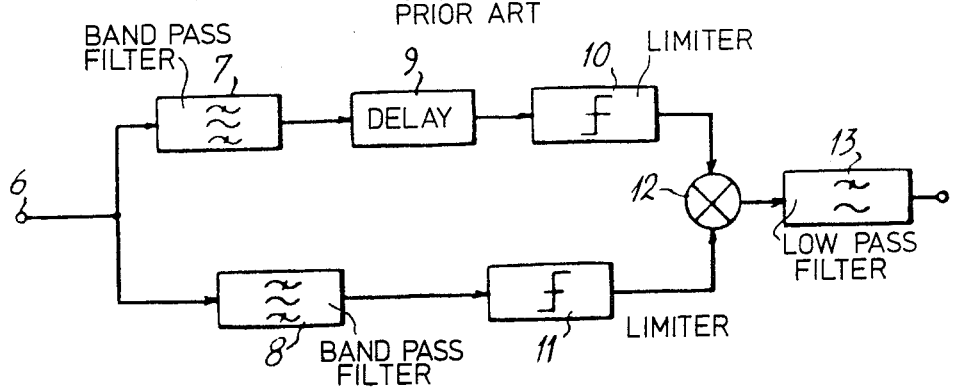
FIG. 3 is the schematic of a demodulator equivalent to that shown in FIG. 2.

The circuit of FIG. 2, as shown in FIG. 3 can be modified while giving the same result. In FIG. 3, input 6 of the frequency modulated carrier is connected, in parallel, to two bandpass filters 7 and 8. The output of filter 7 is connected to the input of a delay circuit 9 whose output is connected to the input of a limiter 10. The output of filter 8 is connected to the input of a limiter 11. The outputs of limiters 10 and 11 are respectively connected to the inputs of a mixer 12 whose output is connected to the input of a low pass filter 13 which yields the demodulated signal. The filters 7 and 8 are identical to filter 1, the delay circuit 9 is identical to circuit 4 and the limiters 10 and 11 are identical to limiter 2. A person skilled in the art can verify that the two setups are equivalent.

French Patent No. FR-A-2 312 881 describes a differential demodulator for digital phase shift modulated waves, this demodulator comprising a surface acoustic wave device, as shown in FIG. 2 of that patent, an input transducer and two output transducers located at different distances from the input transducer, the outputs of the output transducers being respectively connected to the inputs of a mixer.

Finally, we recall that the MDP2-4 modulation described in European patent No. EP-A-0 032 325, is demodulated by a simple conventional differential demodulator.

Figure 4:
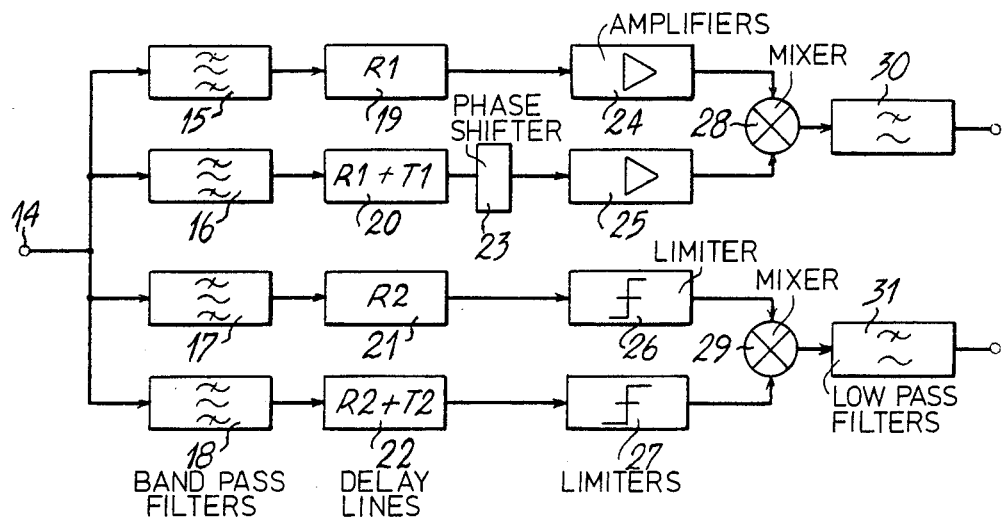
FIG. 4 is a block diagram of a demodulator in accordance with the invention.

A block diagram of a demodulator in accordance with the invention is shown in FIG. 4. Input 14 of the modulated carriers is connected, in parallel, to the inputs of four bandpass filters 15 to 18. The outputs of filters 15 to 18 are respectively connected to the inputs of four delay lines 19 to 22. The output of delay circuit 20 is connected to the input of a 90° phase shifter 23. The outputs of circuits 19 and 23 are connected to the inputs of two amplifiers 24 and 25. The outputs of delay circuits 21 and 22 are respectively connected to the inputs of two limiters 26 and 27. The outputs of amplifiers 24 and 25 are respectively connected to the inputs of a mixer 28. The outputs of limiters 26 and 27 are respectively connected to the inputs of a mixer 29. The outputs of mixers 28 and 29 are respectively connected to the inputs of two low pass filters 30 and 31, filter 30 producing the digital signal and filter 31 producing the analog video signal.

The two bandpass filters 15 and 16 are identical. They are centered at the carrier frequency F1 and have a bandwidth of the order of 21 MHz. Delay circuit 19 introduces an arbitrary delay R1 while delay circuit 20 introduces a delay (R1+T1), where T1 is approximately equal to the duration of one bit and must satisfy the relationship $T1=(2N+1)/4f_o$, $f_o$ being the modulated carrier center frequency. In the case of standard UER, COM.T 490, T1 is equal to 49.4 nanoseconds. Amplifiers 24 and 25 are identical linear amplifiers. In practice, the group of circuits 15, 16, 19, 20, 23, 24, 25, 28 and 30 operate as a differential demodulator like the demodulator of FIG. 2 of French patent No. FR-A-2 312 881. Thus with the carrier F1 being modulated by phase shifts during the time interval t2-t1 of FIG. 1, the output of low pass filter 30 yields the digital modulating signal.

The two bandpass filters 17 and 18 are identical. They are centered on the carrier frequency F2 and have a bandwidth of 27 MHz. Delay circuit 21 introduces an arbitrary delay R2 while delay circuit 22 introduces the delay (R2+T2). The bandwidth between the peaks of the discriminator thus realized is equal to ½T2 and the frequency corresponding to zero output voltage is defined by the relationship $T2=(2M+1)/4f_o$. In the embodiment described, T2 is of the order of 15 nanoseconds. In practice, the set of circuits 17, 18, 21, 22, 26, 27, 29 and 31 operates like the frequency demodulator of FIG. 3. Thus with the carrier F2 being frequency modulated during the time interval t0-t2 of FIG. 1, the output of low pass filter 31 yields the useful video signal.

We will now describe embodiments of solid state surface acoustic wave devices that each fulfill the duties of filters 15 to 18 and of delay circuits 19 to 22.

Figure 5:
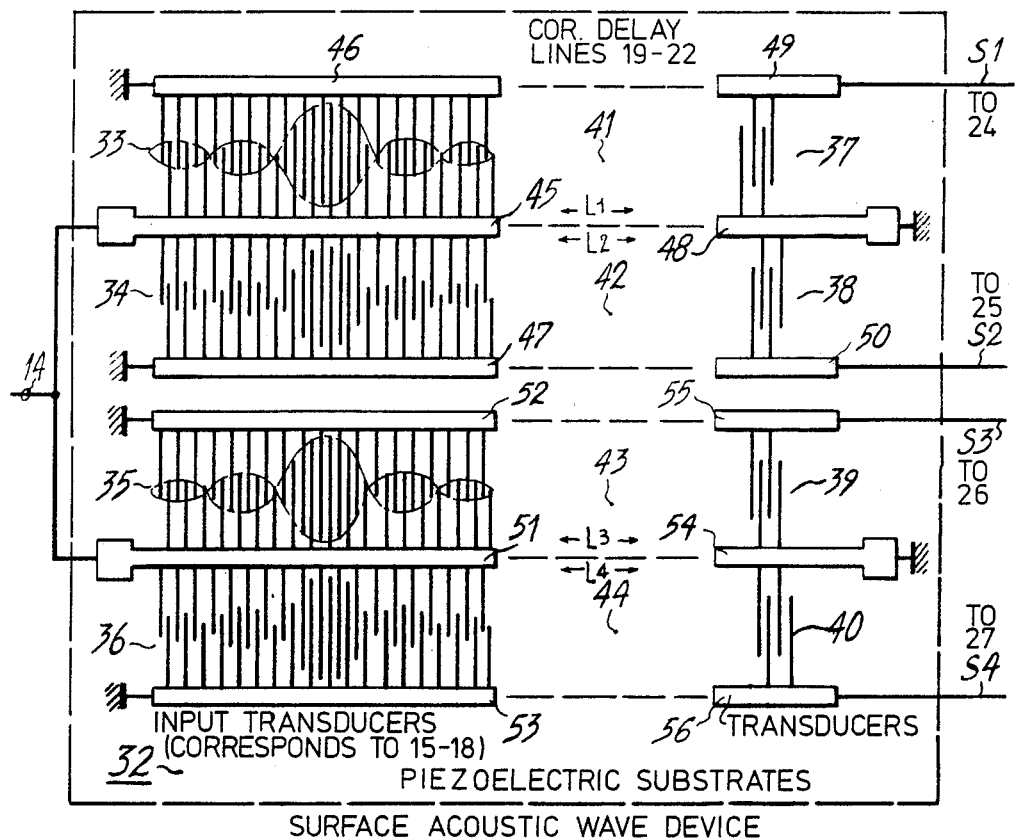
FIG. 5 is a schematic view of a surface acoustic wave device in accordance with the invention.

In FIG. 5, we have shown a piezoelectric substrate surface acoustic wave device 32 on which are provided, four input transducers 33 to 36 and four output transducers 37 to 40 which respectively define among themselves four acoustic wave propagation paths 41 to 44, each path being the same width as the input transducers.

The input transducers 33 and 34 have in common an electrode 45 which is connected to the signal input 14. The other two electrodes 46 and 47 of transducers 33 and 34 are connected to ground. In transducer 33, the interleaved combs of electrodes 45 and 46 are modulated, that is they are made up of varied length fingers, to obtain a predetermined frequency response curve. The same applies to the interleaved combs of electrodes 45 and 47 whose shapes are identical to the interleaved combs of 45 and 46.

In each comb, the space between two consecutive electrodes at the same voltage is even and it is the same for the transmitting and receiving comb of the same filtering group. In practice, this space is approximately equal to $v/F_1$, where v is the velocity of the waves at the surface of substrate 32, that is approximately 3500 m/s depending on the crystal used, for the groups 33, 34–37, 38 and approximately equal to $v/F_2$ for the groups 35, 36–39, 40.

The paths 41 and 42 are parallel. The output transducers 37 and 38 also have in common an electrode 48 which is connected to ground while the other two electrodes 49 and 50 constitute two output electrodes S1 and S2. In the embodiments shown, the combs of electrodes 48 to 50 have fixed length fingers.

The distance L1 between the combs' central fingers of transducers 33 and 37 is such that $L1=vR1$, where v is the propagation velocity of the surface acoustic waves on substrate 32. The distance L2 between the central fingers of transducers 34 and 38 is such that $L2=v(R1+T1)$. As shown in FIG. 5, the central fingers of transducers 33 and 34 are aligned while those of transducers 37 and 38 are offset.

The transducers 35 and 36 also have in common an electrode 51 which is connected to the signal input 14. The two other electrodes 52 and 53 from transducers 35 and 36 are at ground. In each of the transducers 35 and 36, the interleaved combs are modulated in such a way as to obtain a predetermined frequency response curve. Of course, the frequency responses of pair 33, 34 and of pair 35, 36 are different, as well as the center frequencies of the response curves, the first corresponding to F1 and the second corresponding to F2.

The paths 43 and 44 are also parallel, and preferably parallel to paths 41 and 42. The output transducers 39 and 40 also have in common an electrode 54 which is connected to ground while the other two electrodes 55 and 56 constitute two output electrodes 53 and 54.

The distance L3 between the central fingers of combs 35 and 39 is such that $L3=vR2$ while the distance L4 between the central fingers of transducers 36 and 40 is such that $L4=(R2+T2)$. The central fingers of transducers 35 and 36 are aligned while those of transducer 39 and 40 are offset.

The outputs S1 to S4 are respectively destined to be connected to the inputs of circuits 24 to 27 of FIG. 4.

It is understood that the input transducers 33 to 36 fulfill the role of filters 15 to 18 of FIG. 4 while paths 41 to 44 introduce the delays foreseen in circuits 19 to 22.

Figure 6:
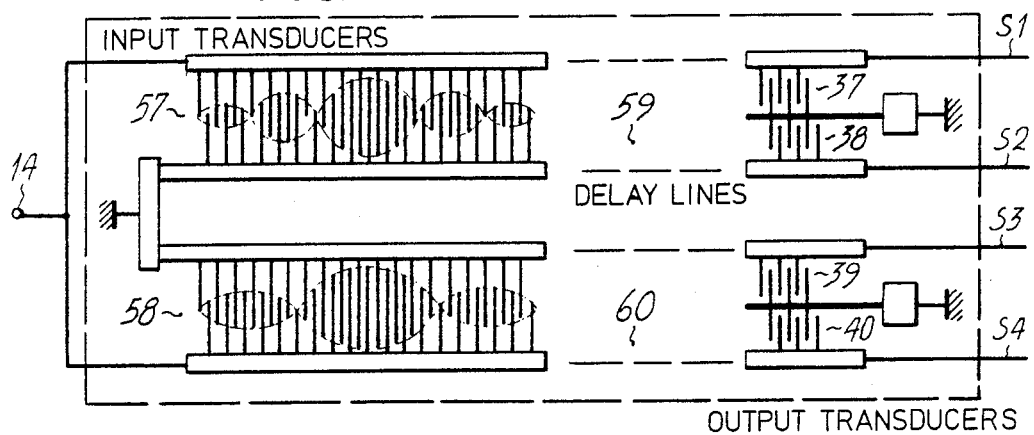
FIG. 6 is a schematic view of a first variation of the device of FIG. 5.

In the variation shown in FIG. 6, the input transducers 33 and 34 have been replaced by a single transducer 57, and the transducers 35 and 36 by a single transducer 58. Transducer 57 has a width which is equal to the sum of the path widths of delay lines 41 and 42. Its electrode adjacent to transducer 58 is at ground while its second electrode is connected to input 14. Transducer 57 which has a frequency response curve identical to that of transducers 33 and 34 also has a modulated comb. In transducer 58, the electrode adjacent to 57 is also connected to ground while the other electrode is connected to input 14. Its response curve is identical to that of transducers 35 and 36.

On the output side, transducers 37 to 40 (FIG. 5) can be used with, by preference, their electrodes 48 to 51 being as narrow as possible such as to have a minimum loss of the waves initiated by transducers 57 and 58. The central fingers of transducers 57 and 58 are positioned with respect to the output transducers as shown in the realization example of FIG. 5.

In the embodiment example of FIG. 6, the paths 41 and 42 on one hand, and 43 and 44 on the other hand actually respectively make up single paths corresponding to the width of transducers 57 and 58.

Figure 7:
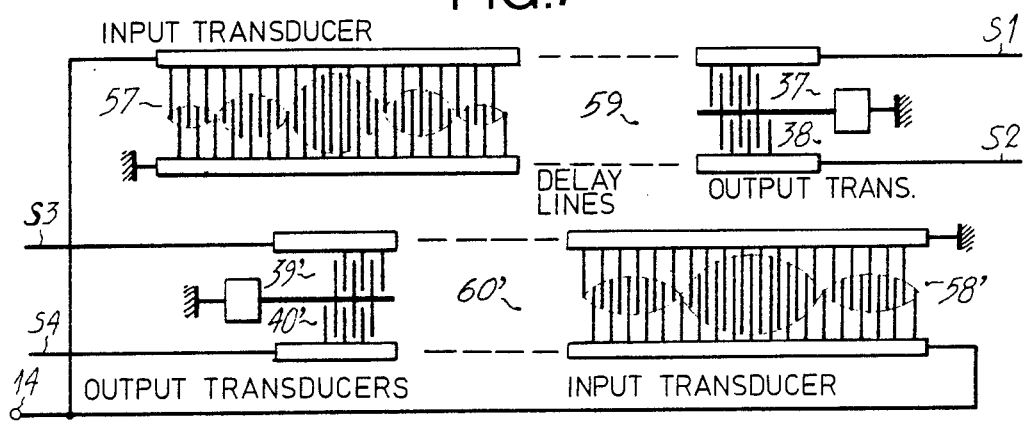
FIG. 7 is a second variation of the device of FIG. 5.

In another variation shown in FIG. 7, we have the input transducer 57 and the output transducers 37 and 38. The input transducer 58 is replaced by an input transducer 58' of same size and shape while, similarly, the output transducers 39 and 40 are replaced by output transducers 39' and 40'. The path 60' between these transducers is directed parallel to path 59, but in opposite direction to the latter.

Figure 8:
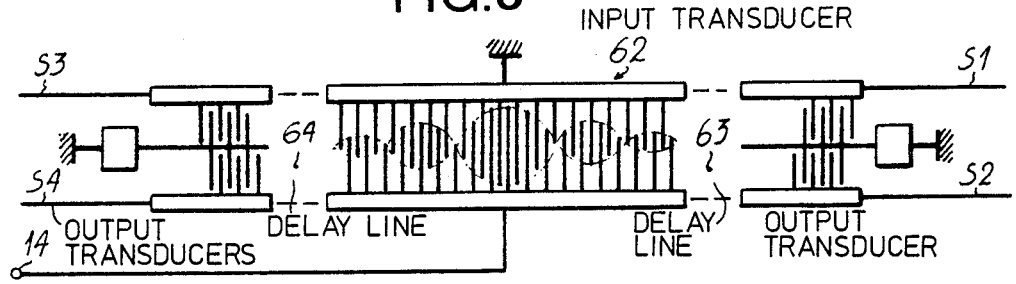
FIG. 8 is a third variation of the device of FIG. 5.

In another variation shown in FIG. 8, the transducers 57 and 58' are replaced by a single input transducer 62 symmetrically transmitting acoustic waves on paths 63 and 64 of which one is similar to path 59 and the other to path 60' of FIG. 7. At the other end of path 59, the output transducers 37 and 38 are provided, and at the other end of path 60', the output transducers 39 and 40. Of course, this variation assumes that the frequencies F1 and F2 are identical, the shape of the input transducer's comb being designed accordingly.

Of course, because of reciprocity, it would be possible in each embodiment described above, to interchange the transmitting and receiving comb characteristics, the global impulse response as well as the global frequency remaining unchanged. We recall that it is obviously the transmitting and receiving comb pair that determines the desired impulse or frequency responses.

The embodiments of the invention in which an exclusive property or privilege is claimed are defined as follows:

1. A receiving circuit having a specific bandwidth for the reception of electrical waves which are frequency modulated in response to an analog signal and which are phase modulated in response to a digital signal, said receiving circuit comprising a surface acoustic wave device formed on a substrate, two pairs of input transducers, two pairs of output transducers, said two pairs of input transducers being mounted on the substrate of the surface acoustic wave device and connected, in parallel, to the input of a receiving circuit, the input transducers initiating acoustic waves corresponding to the signals applied to said input of said receiving circuit, said acounstic waves traveling over two pairs of paths beginning at outputs of said two pairs of input transducers ending at inputs of said two pairs of output transducers, the lengths of the paths of each pair being different, first and second mixers, the outputs of the first pair of output transducers being respectively connected to two inputs of said first mixer, an output of said mixer yielding the digital signal, two limiters, an output of the second pair of output transducers being respectively connected to inputs of said two limiters, the outputs of said limiters being respectively connected to two inputs of said second mixer, said second mixer having an output yielding the analog signal, the difference in the lengths of the first pair of paths introducing a delay in the order of one bit and the difference in the lengths of the paths of the second pair of paths introducing a delay equal to the inverse of twice the specific bandwidth of the receiving circuit.

2. The circuit in accordance with claim 1, wherein said transducers are arranged in a pair of sets of input and output transducers, each of said sets comprising one pair of input transducers and an associated pair of output transducers, each set having a modulated comb giving a predetermined impulse and frequency response.

3. A receiving circuit having a specific bandwidth for the reception of electrical waves which are frequency modulated in response to an analog signal and which are phase modulated in response to a digital signal, said receiving circuit comprising a surface acoustic wave device formed on a substrate, a pair of input transducers, two pairs of output transducers, said pair of input transducers being mounted on the surface acoustic wave device and being connected to an input of a receiving circuit, the input transducers initiating acoustic waves corresponding to input signals appearing at said receiving circuit, said input signals being applied to two pairs of paths beginning at said input transducers and ending at said two pairs of output transducers, the lengths of the paths forming each pair of paths being different, first and second mixers, an output of a first output transducer being connected to inputs of said first mixer, said first mixer having an output yielding the digital signal, two limiters, outputs of a second pair of output transducers being connected to inputs of said two limiters, outputs of said second pair of output transducers being connected to two inputs of said second mixer, said second mixer having an output yielding the analog signal, the difference in the lengths of the paths of the first pair of paths introducing a delay in the order of one bit and the difference in the lengths of the paths of the second pair of paths introducing a delay equal to the inverse of twice the specific bandwidth of the receiving circuit.

4. The circuit in accordance with claim 3 wherein said transducers are arranged in a pair of sets of input and output transducers, each of said sets comprising one input transducer and an associated pair of output transducers, each set having a modulated comb giving a predetermined impulse and frequency response.

5. The receiver circuit in accordance with claim 1 wherein the transducers are located on the surface of the substrate at positions such that the pairs of paths are parallel, but are propagating in opposite directions along said substrate.

6. The receiver circuit in accordance with claim 2 wherein the transducers are located on the surface of the substrate at positions such that the pairs of paths are parallel, but are propagating in opposite directions along said substrate.

7. The receiver circuit in accordance with claim 3 wherein the transducers are located on the surface of the substrate at positions such that the pairs of paths are parallel, but are propagating in opposite directions along said substrate.

8. The receiver circuit in accordance with claim 4 wherein the transducers are located on the surface of the substrate at positions such that the pairs of paths are parallel, but are propagating in opposite directions along said substrate.

9. The receiver circuit in accordance with claim 5 wherein the transducers are located on the surface of the substrate at positions such that the pairs of paths are parallel, but are propagating in opposite directions along said substrate.

10. A receiving circuit having a specific bandwidth for the reception of electrical waves which are frequency modulated in response to an analog signal and which are phase modulated in response to a digital signal, said receiving circuit comprising a surface acoustic wave device formed on a substrate, one bidirectional input transducer, two pairs of output transducers, said bidirectional input transducer being located in the central part of said substrate and connected to an input of a receiving circuit, the output transducers being located on opposite ends of said substrate, the input transducer initiating acoustic waves corresponding to the signals applied to said input of said receiving circuit, said signals being applied to two pairs of paths beginning on opposite sides of said bidirectional input transducer and extending in opposite directions to end at the inputs of said two two pairs of output transducers, the lengths of the paths of each pair of paths being different, first and second mixers, an output of a first output transducer being connected to inputs of said first mixer, said first mixer having an output yielding the digital signal, two limiters, outputs of a second pair of output transducers being connected to inputs of said two limiters, outputs of said second pair of output transducers being connected to two inputs of said second mixer, said second mixer having an output which yields the analog signal, the difference in the lengths of the paths of the first pair of paths introducing a delay in the order of one bit and the difference in the length of the paths of the second pair of paths introducing a delay equal to the inverse of twice the specific bandwidth of the receiving circuit.

* * * * *